US009659860B2

(12) United States Patent
Schenker et al.

(10) Patent No.: US 9,659,860 B2
(45) Date of Patent: May 23, 2017

(54) METHOD AND STRUCTURE TO CONTACT TIGHT PITCH CONDUCTIVE LAYERS WITH GUIDED VIAS

(71) Applicant: Intel Corporation, Santa Clara, CA (US)

(72) Inventors: Richard E. Schenker, Portland, OR (US); Elliot N. Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/905,269

(22) PCT Filed: Aug. 21, 2013

(86) PCT No.: PCT/US2013/056039
§ 371 (c)(1),
(2) Date: Jan. 14, 2016

(87) PCT Pub. No.: WO2015/026342
PCT Pub. Date: Feb. 26, 2015

(65) Prior Publication Data
US 2016/0148869 A1     May 26, 2016

(51) Int. Cl.
| | |
|---|---|
| *H01L 23/532* | (2006.01) |
| *H01L 21/02* | (2006.01) |
| *H01L 21/033* | (2006.01) |
| *H01L 21/311* | (2006.01) |
| *H01L 23/528* | (2006.01) |
| *H01L 23/522* | (2006.01) |
| *H01L 21/768* | (2006.01) |

(52) U.S. Cl.
CPC ...... *H01L 23/5226* (2013.01); *H01L 21/0217* (2013.01); *H01L 21/02115* (2013.01);
(Continued)

(58) Field of Classification Search
CPC ............. H01L 23/481; H01L 21/76832; H01L 2924/0002; H01L 21/76802;
(Continued)

(56) References Cited

U.S. PATENT DOCUMENTS

| | | |
|---|---|---|
| 5,888,897 A | 3/1999 | Liang |
| 6,740,985 B1 | 5/2004 | Zhao |

(Continued)

FOREIGN PATENT DOCUMENTS

| | | |
|---|---|---|
| JP | 09045765 | 2/1997 |
| JP | 2001313334 | 11/2001 |

(Continued)

OTHER PUBLICATIONS

PCT Search Report mailed May 28, 2014, PCT Appln. No. PCT/US2013/056039, 3 pages.
(Continued)

*Primary Examiner* — Jasmine Clark
(74) *Attorney, Agent, or Firm* — Blakely, Sokoloff, Taylor & Zafman LLP

(57) ABSTRACT

An apparatus including a circuit substrate; a first interconnect layer in a first plane on the substrate and a second interconnect layer in a different second plane on the substrate; and a hardmask layer separating the first interconnect layer and the second interconnect layer, wherein the hardmask layer comprises alternating guide sections comprising different hard mask materials, and a via guide. A method including forming a dielectric layer on an integrated circuit structure; forming a first interconnect layer having interconnect lines in the dielectric layer; forming a hardmask layer on a surface of the dielectric layer, the hardmask layer comprising alternating hardmask materials which form guide sections over the interconnect lines; forming a via guide in one of the guide sections; and forming a second interconnect layer over the hardmask guide layer which is electrically connected to one of the interconnect lines through the via guide.

20 Claims, 15 Drawing Sheets

(52) U.S. Cl.
CPC .. *H01L 21/02164* (2013.01); *H01L 21/02167* (2013.01); *H01L 21/02178* (2013.01); *H01L 21/02181* (2013.01); *H01L 21/02186* (2013.01); *H01L 21/0332* (2013.01); *H01L 21/0337* (2013.01); *H01L 21/31144* (2013.01); *H01L 21/76804* (2013.01); *H01L 21/76808* (2013.01); *H01L 21/76816* (2013.01); *H01L 21/76877* (2013.01); *H01L 21/76897* (2013.01); *H01L 23/528* (2013.01); *H01L 2924/0002* (2013.01)

(58) Field of Classification Search
CPC ........... H01L 21/3114; H01L 21/76898; H01L 23/5226; H01L 2225/06541; H01L 21/32139; H01L 21/76804; H01L 21/31144; H01L 21/02115; H01L 21/76816; H01L 21/76877; H01L 21/76808; H01L 21/76897
See application file for complete search history.

(56) References Cited

U.S. PATENT DOCUMENTS

| | | |
|---|---|---|
| 2004/0232558 A1 | 11/2004 | Toda |
| 2008/0272467 A1 | 11/2008 | Bok et al. |
| 2010/0261330 A1 | 10/2010 | Nansei et al. |
| 2012/0213009 A1* | 8/2012 | Aritome ............ G11C 16/0408 365/185.29 |

FOREIGN PATENT DOCUMENTS

| | | |
|---|---|---|
| JP | 2007281197 | 10/2007 |
| KR | 1020060108601 | 10/2006 |
| TW | 201250773 | 12/2012 |
| WO | WO-2014046856 | 3/2014 |

OTHER PUBLICATIONS

"Semiconductor Manufacturing Process Technologies: Thin Film Deposition & Photoresist Strip," Retrieved via Internet on Jun. 18, 2013 at novellus.com/products/process_technologies/, 3 pages.
Mack, C., "Semiconductor Lithography (Photolithography)—The Basic Process," Retrieved via Internet on Jun. 18, 2013 at lithoguru.com/scientist/lithobasics.html, 12 pages.
Wolf, S., Excerpt from *Silicon Processing for the VLSI ERA*, vol. 4, p. 674-679, Retrieved via Internet on Jul. 25, 2013 at latticepress.com/damascene.html.
Intel Corporation, International Preliminary Report on Patentability mailed Feb. 23, 2016, PCT/US2013/056039, 5 pages.
Taiwanese Office Action dated Jan. 4, 2016, TW Appln. No. 103127921, with English-language translation, 11 pages.
Intel Corporation, Extended European Search Report issued Feb. 27, 2017, Application No. 13892007.9.

* cited by examiner

METHOD AND STRUCTURE TO CONTACT TIGHT PITCH CONDUCTIVE LAYERS WITH GUIDED VIAS

CROSS-REFERENCE TO RELATED APPLICATION

This patent application is a U.S. National Phase Application under 35 U.S.C. §371 of International Application No. PCT/US2013/056039, filed Aug. 21, 2013, entitled METHOD AND STRUCTURE TO CONTACT TIGHT PITCH CONDUCTIVE LAYERS WITH GUIDED VIAS.

BACKGROUND

Field

Integrated circuit processing.

Description of Related Art

Modern integrated circuits use conductive (e.g. metal) interconnect layers to connect the individual devices on a chip and/or to send and/or receive signals external to the device(s). Common types of interconnect layers include copper and copper alloy interconnections (lines) coupled to individual devices, including other interconnections (lines) by interconnections through vias, sometimes referred to as via layers or contact layers. It is not uncommon for an integrated circuit to have multiple levels of interconnections (e.g., five or six levels) separated by dielectric materials.

As these interconnect layers or lines are manufactured at smaller pitches (e.g. narrower and/or closer together) in order to accommodate the need for smaller chips, however, it becomes more and more difficult to properly align the vias with the desired interconnect layer. In particular, during manufacturing, the location of the via edges with respect to the interconnect layer or line it is to contact will have variation (e.g. be misaligned) due to natural manufacturing variation. A via, however, must allow for connection of one interconnect layer to the desired underlying interconnect layer or line without erroneously connecting to a different interconnect layer or line. If the via is misaligned and contacts the wrong metal feature (e.g. an undesirable interconnect layer), the chip may short circuit resulting in degraded electrical performance. One solution to address this issue is to reduce the via size (e.g. making the via narrower). Reducing the via size, however, results in degraded performance (due to higher resistance) and potential reduced yield in via manufacturing.

DETAILED DESCRIPTION

Figure 1:
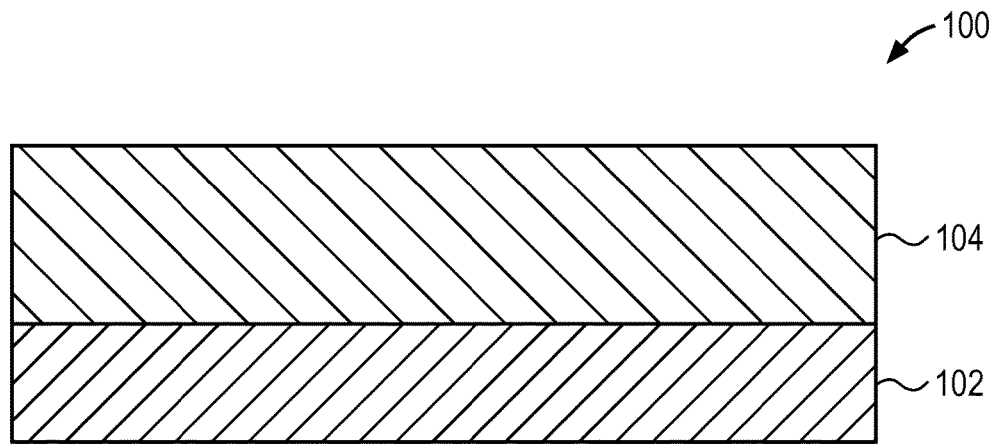
FIG. 1 shows a schematic cross-sectional side view of a portion of a circuit structure including a dielectric layer formed over a substrate.

FIG. 1 shows a schematic cross-sectional side view of a portion of a circuit structure including a dielectric layer formed over a substrate. A typical integrated circuit structure such as a microprocessor chip may have, for example, multiple interconnect layers or levels separated from one another by an interlayer dielectric (ILD) material. Referring to FIG. 1, structure 100 includes substrate 102 which may be the wafer substrate (e.g., a portion of a silicon wafer) having circuit devices, including transistors, thereon as well as one or more levels of interconnections to devices. It is appreciated that the techniques described herein may be used for various interconnections within an integrated circuit including to devices that include circuit devices and other interconnections.

Overlying substrate 102 in FIG. 1 is dielectric layer 104. In one embodiment, dielectric layer 104 may be an ILD layer. A representative material for dielectric layer 104 is a material having, for example, a dielectric constant (k) less than the dielectric constant of silicon dioxide ($SiO_2$) (e.g., a "low k" material). Representative low k materials include materials containing silicon, carbon and oxygen which may be referred to as polymers and that are known in the art. In one embodiment, dielectric layer 104 is porous.

Figure 2:
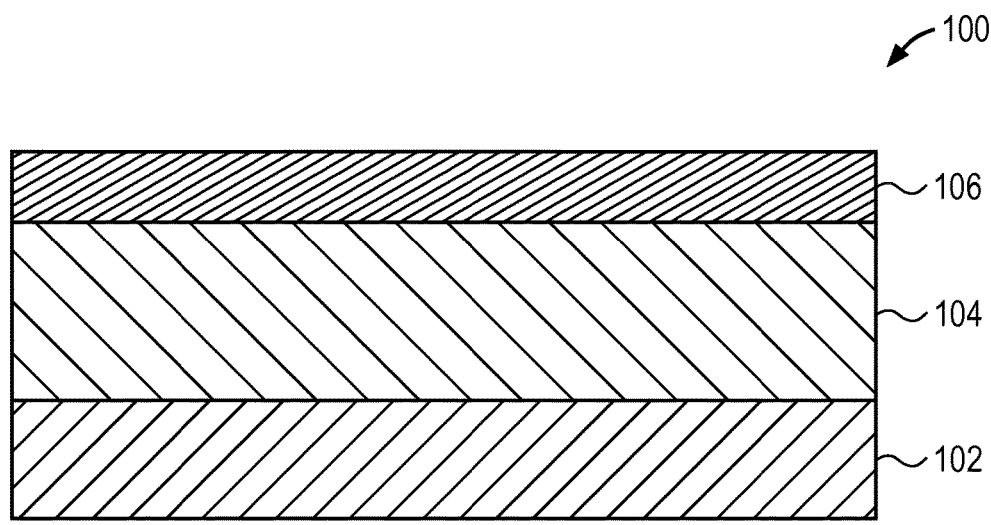
FIG. 2 shows the structure of FIG. 1 with the introduction of a hardmask layer.

FIG. 2 shows the structure of FIG. 1 with the introduction of a hardmask layer. Hardmask layer 106 may be applied over dielectric layer 104 according to any standard semiconductor processing technique. In one embodiment, hardmask layer 106 is a dielectric material. Representative dielectric materials may include, but are not limited to, various oxides, nitrides and carbides, for example, silicon oxide, titanium oxide, hafnium oxide, aluminum oxide, oxynitride, zirconium oxide, hafnium silicate, lanthanum oxide, silicon nitride, boron nitride, amorphous carbon, silicon carbide and other similar dielectric materials. In one embodiment, hardmask layer 106 is deposited, for example, by a plasma deposition process, to a thickness to serve as a mask to underlying dielectric layer 104 (e.g., to protect from undesired modification of the dielectric material from energy used in subsequent mask registration). In one embodiment, a representative thickness is a thickness that will not significantly affect an overall dielectric constant of ILD (dielectric layer plus hardmask layer 106) but at most will marginally affect such overall dielectric constant. In one embodiment, a representative thickness is on the order of 30 angstroms (Å)±20 Å. In another embodiment, a representative thickness is on the order of two to five nanometers (nm).

Figure 3:
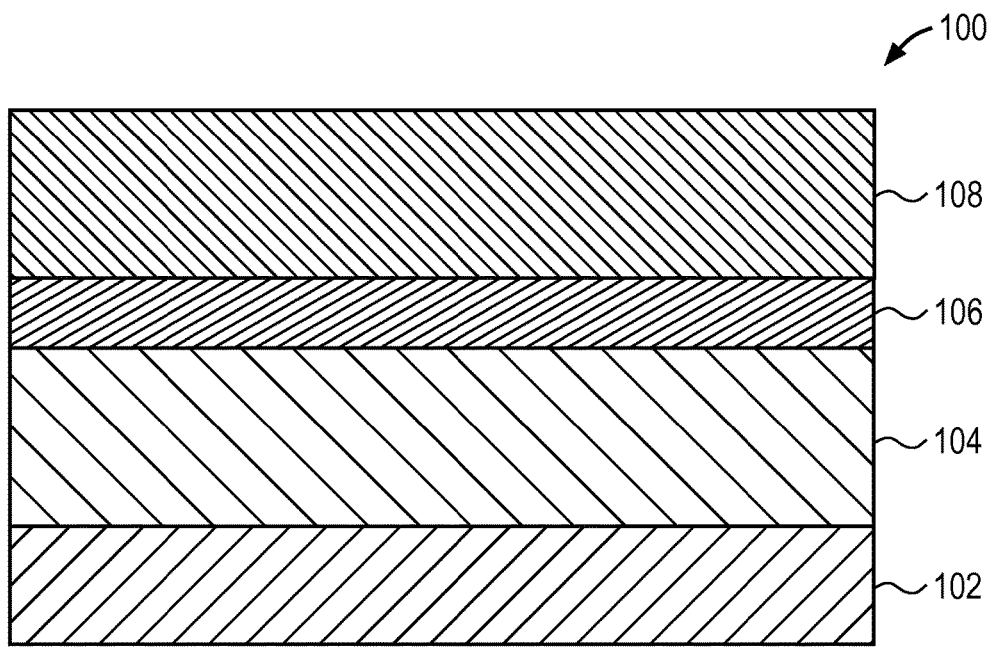
FIG. 3 shows the structure of FIG. 2 following the formation of a backbone material on the hardmask layer.

FIG. 3 shows the structure of FIG. 2 following the formation of a backbone material on the hardmask layer. Backbone material 108 may be applied as a layer over hardmask layer 106. Representative backbone materials may include, but are not limited to, polysilicon, amorphous silicon, amorphous carbon, silicon nitride and germanium.

Figure 4:
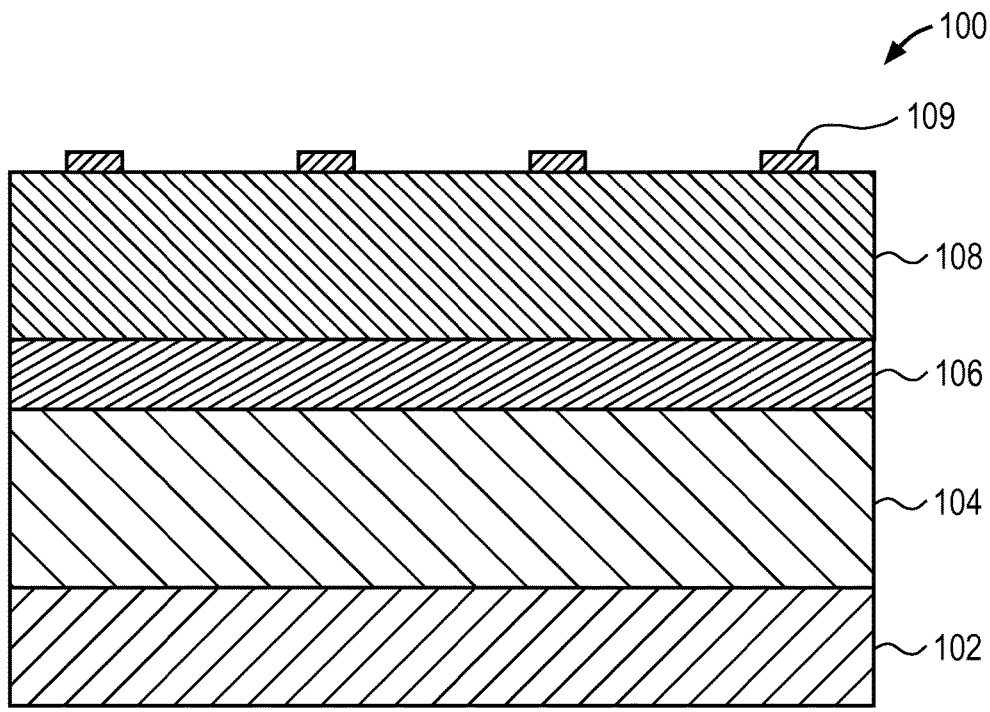
FIG. 4 shows the structure of FIG. 3 following the introduction of a photoresist material patterned to define one or more trenches within the backbone material to form a backbone structure.
Figure 5:
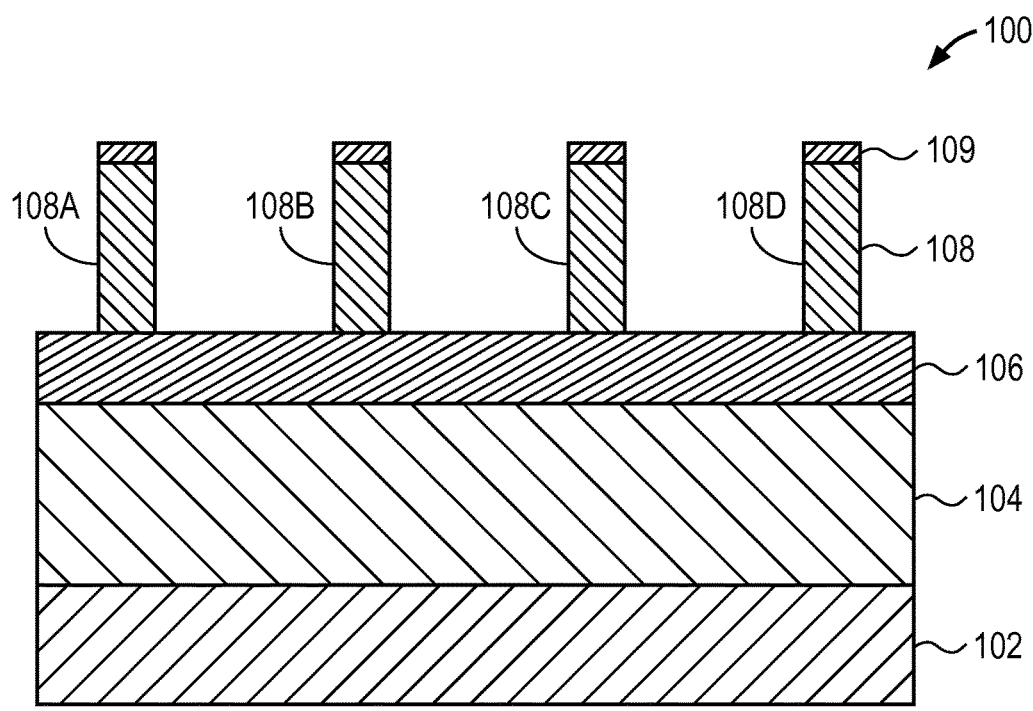
FIG. 5 shows the structure of FIG. 4 following the opening of trenches to form the backbone structure.

FIG. 4 shows the structure of FIG. 3 following the introduction of a photoresist material patterned to define one or more trenches within the backbone material to form a backbone structure as shown in FIG. 5. Photoresist material 109 may form a pattern over backbone material 108 which may in turn, be used to form a pattern within backbone material 108.

Representatively, FIG. 5 shows the structure of FIG. 4 following the opening of trenches to form the backbone pattern within backbone material 108. The backbone pattern, which includes backbone structures 108A, 108B, 108C and 108D, can be formed using any standard lithography processing steps. Alternatively, an etch or wet cleans semiconductor processing technique may be used to form backbone structures 108A-108D. The backbone structures 108A-108C illustrated in FIG. 5 are sometimes referred to as a mandrel structure and, as will be described in more detail below, facilitate formation of via guide sections within hardmask layer 106.

Figure 6:
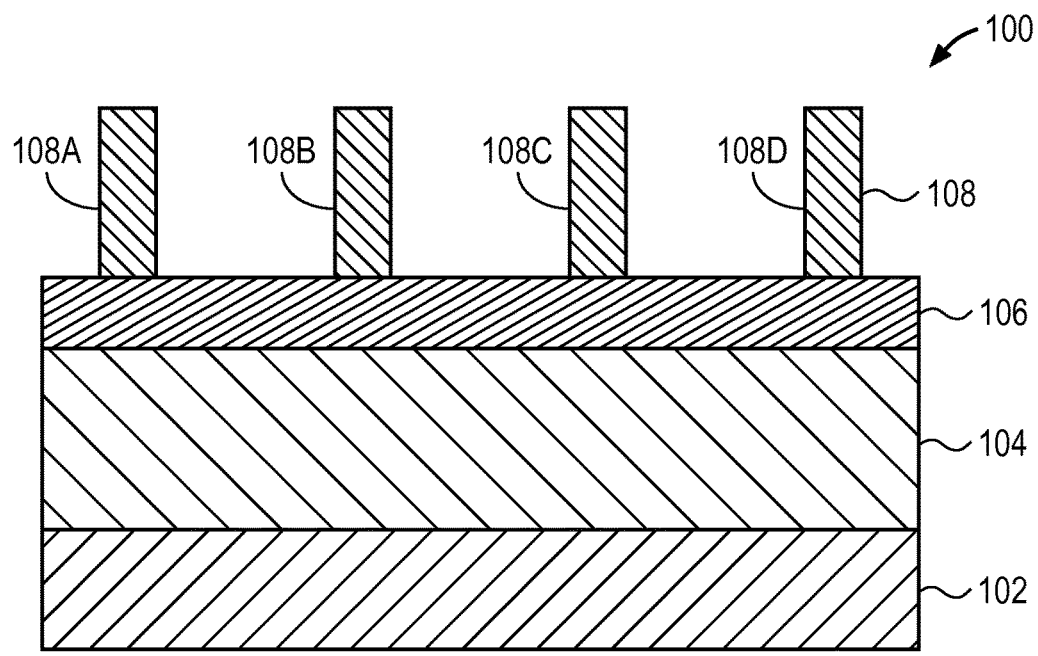
FIG. 6 shows the structure of FIG. 5 following the removal of the photoresist material.

FIG. 6 shows the structure of FIG. 5 following the removal of the photoresist material. In particular, once the backbone structures 108A-108D are formed, photoresist material 109 is removed using any standard semiconductor processing removal technique. Representatively, photoresist material 109 may be removed by a wet or dry (plasma) stripping technique. Removal of photoresist material 109 results in backbone structures 108A-108D overlying hardmask layer 106 such that portions of hardmask layer 106 are exposed between the backbone structures 108A-108D.

Figure 7:
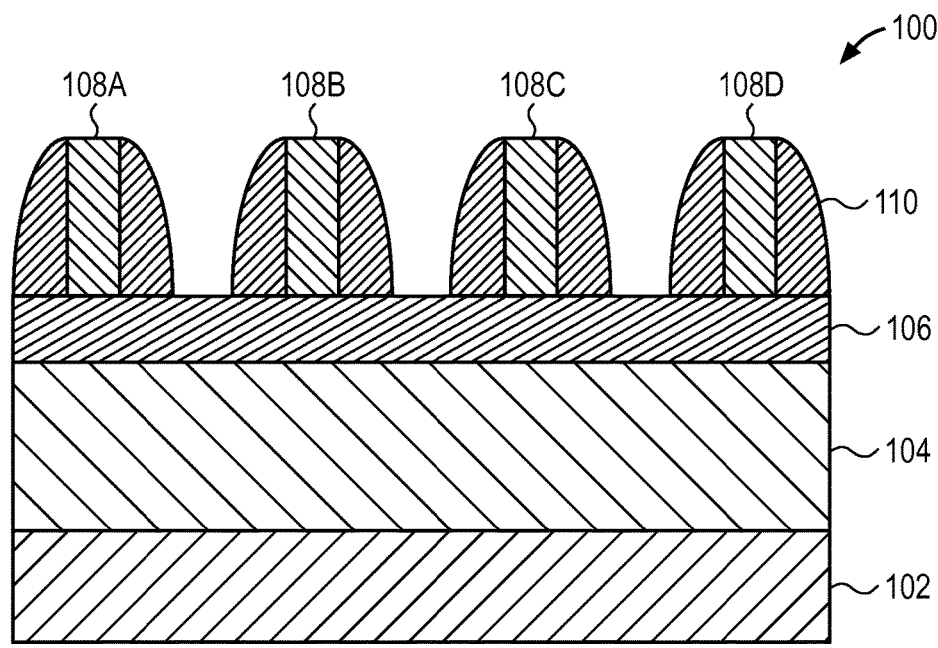
FIG. 7 shows the structure of FIG. 6 following the formation of spacers around the backbone structure.

FIG. 7 shows the structure of FIG. 6 following the formation of spacers around the backbone structures. Spacers 110 are side spacers formed along sides of backbone structures 108A-108D. Spacers 110 may be formed of any typical spacer material and by any standard semiconductor processing technique. Representatively, the material of spacers 110 may include, but is not limited to, silicon dioxide, silicon nitride or amorphous silicon. Spacers 110 serve to prevent removal of backbone structures 108A-108D while allowing for removal of the exposed areas of hardmask layer 106 during subsequent processing steps used to form via guide sections in hardmaks layer 106 and interconnect lines within dielectric layer 104.

Figure 8:
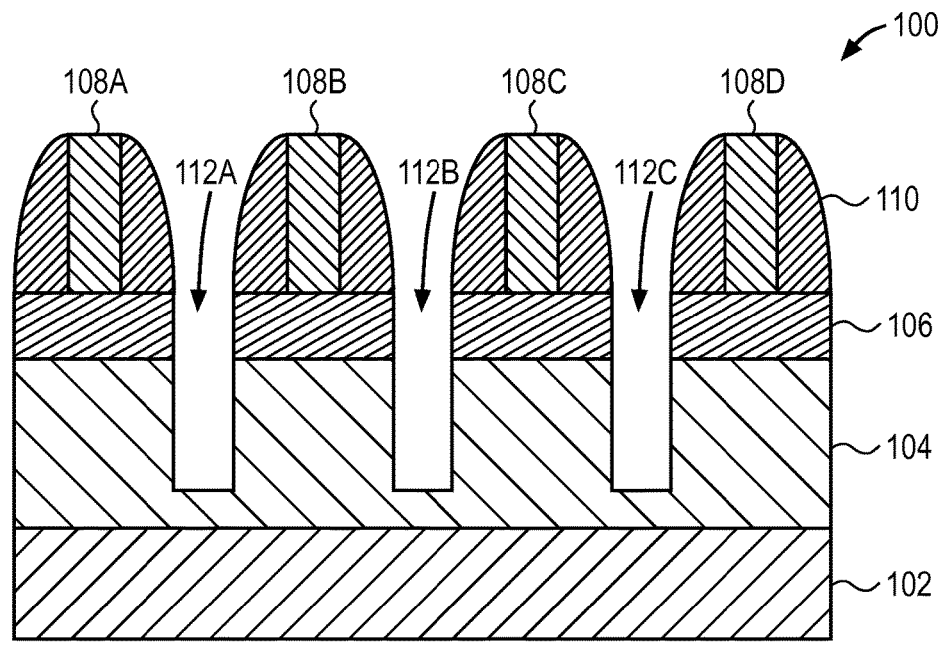
FIG. 8 shows the structure of FIG. 7 following etching of openings within the hardmask layer and the dielectric layer.

FIG. 8 shows the structure of FIG. 7 following etching of openings within the hardmask layer and the dielectric layer. Openings 112A, 112B and 112C may be formed between backbone structures 108A-108D and their associated spacers 110. In this aspect, openings 112A-112C are formed through the exposed portions of hardmask layer 106 and the underlying portions of dielectric layer 104. In some embodiments, openings 112A-112C are formed using a selective dry etch processing technique which allows for removal of the exposed portions of hardmask layer 106 and portions of dielectric layer 104 but does not remove spacers 110 and backbone structures 108A-108D. Openings 112A-112C may be of any depth sufficient to form interconnect lines within dielectric layer 104 as will be discussed in more detail in reference to FIG. 9.

Figure 9:
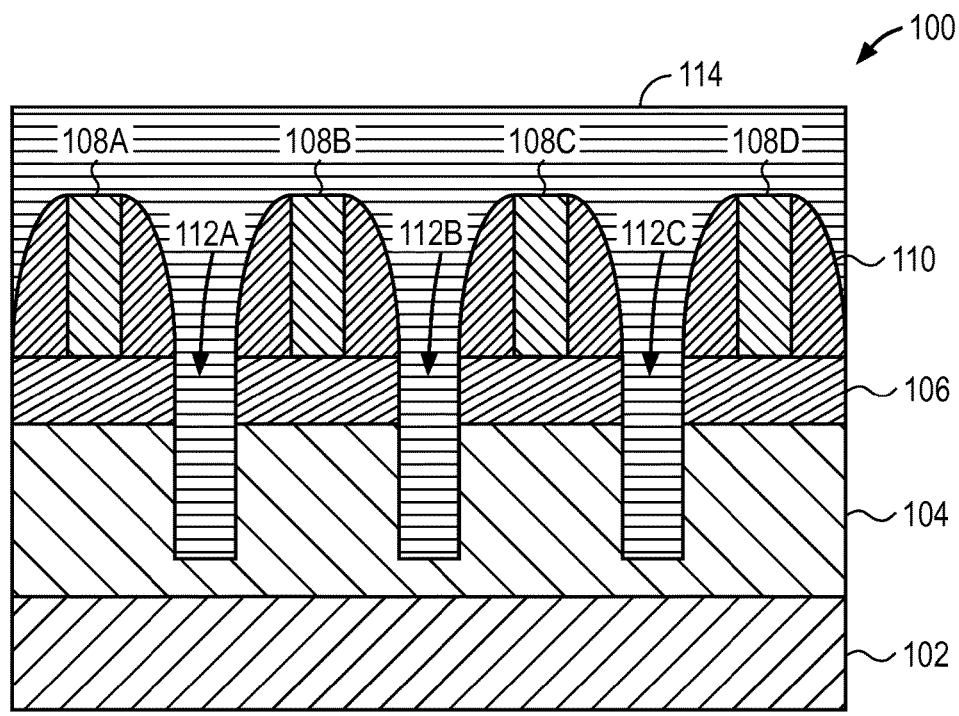
FIG. 9 shows the structure of FIG. 8 following filling of the openings with an interconnect material.

FIG. 9 shows the structure of FIG. 8 following filling of the openings with an interconnect material. Representatively, as illustrated in FIG. 8, openings 112A-112C are formed through dielectric layer 104 to a desired depth. Once formed, openings 112A-112C are filled with an interconnect material 114. Interconnect material 114 may be any conductive material, such as a metal material, for example, copper, aluminum or tungsten.

Figure 10:
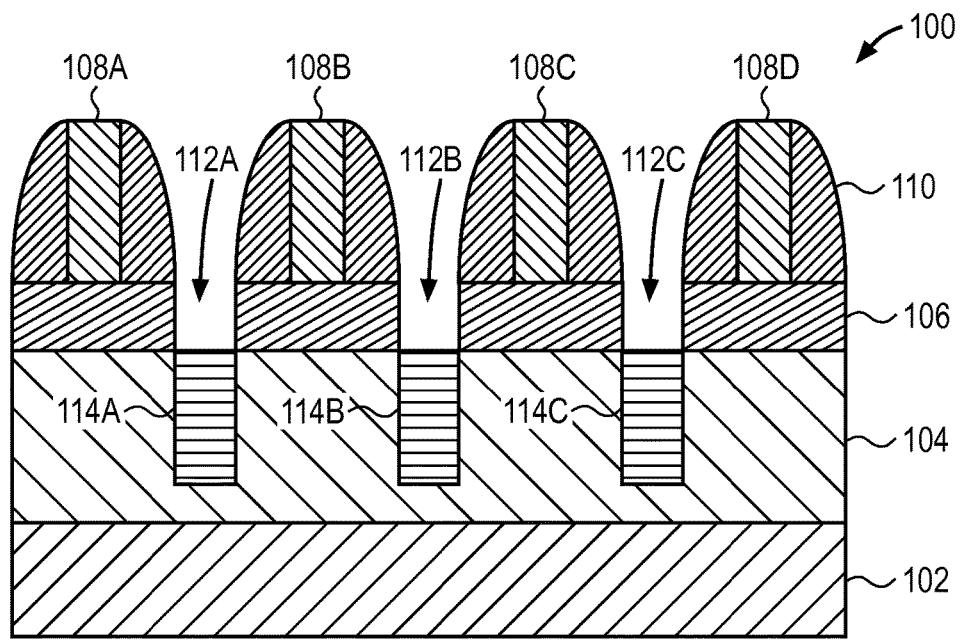
FIG. 10 shows the structure of FIG. 9 following polishing and recessing of the interconnect material to form interconnect lines within the dielectric layer.

FIG. 10 shows the structure of FIG. 9 following polishing and recessing of the interconnect material to form interconnect lines within the dielectric layer. Representatively, portions of interconnect material 114 surrounding backbone structures 108A-108D and spacers 110 are polished using any standard polishing technique and the portions of interconnect material 114 remaining within openings 112A-112C are recessed below hardmask layer 106 to form a first set of interconnect lines 114A, 114B and 114C within dielectric layer 104. In one embodiment, interconnect material 114 may be recessed with a wet etch process designed to selectively etch interconnect material 114 without etching any other materials (e.g. spacers 110, backbone structures 108A-108D and hardmask layer 106). Interconnect lines 114A-114C may be, for example, wiring lines that are used to provide connections to and between devices connected to other interconnect layers or lines within other planes of structure 100.

Figure 11:
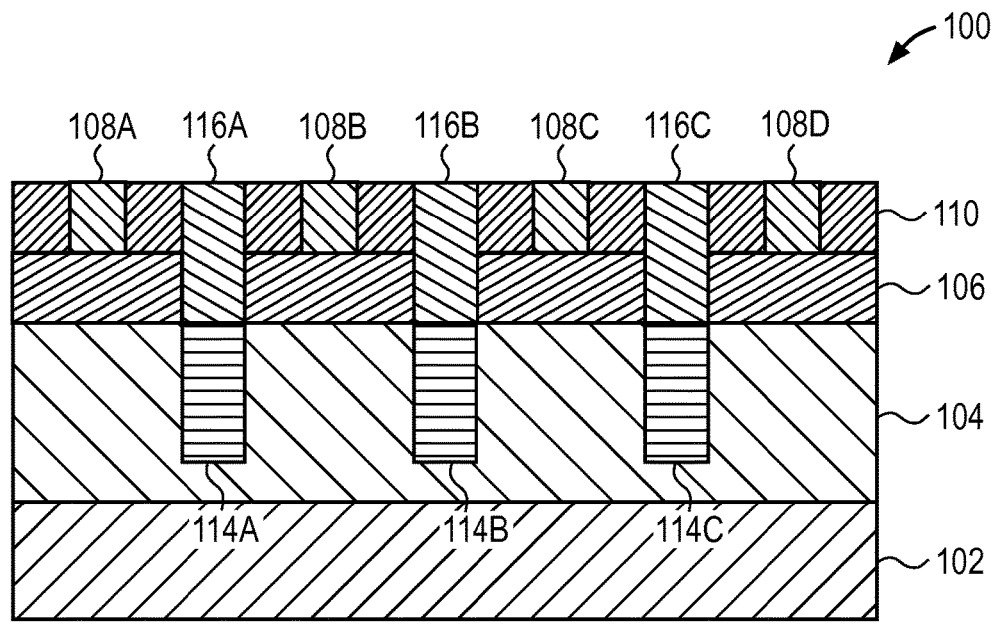
FIG. 11 shows the structure of FIG. 10 following filling of the openings within the hardmask layer with a hardmask material to form a set of via guide sections.

FIG. 11 shows the structure of FIG. 10 following filling of the openings within the hardmask layer with a hardmask material to form a set of via guide sections. In particular, the portions of openings 112A-112C remaining above interconnect lines 114A-114C are filled with a hardmask material. The hardmask material is subsequently polished along with spacers 110 and backbone structures 108A-108D to form a first set of via guide sections 116A, 116B and 116C within hardmask layer 106. The hardmask material of via guide sections 116A-116C is a hardmask material different than the hardmask material of hardmask layer 106. Representatively, the hardmask material of via guide sections 116A-116C may include a dielectric material which is sufficiently different chemically than the material of hardmask layer 106 to allow for etching of the hardmask material of via guide sections 116A-116C selective to hardmask layer 106. Representative dielectric materials may include, but are not limited to, various oxides, nitrides and carbides, for example, silicon oxide, titanium oxide, hafnium oxide, aluminum oxide, oxynitride, zirconium oxide, hafnium silicate, lanthanum oxide, silicon nitride, boron nitride, amorphous carbon, silicon carbide and other similar dielectric materials. For example, the material of via guide sections 116A-116C may be silicon oxide and the material of hardmask layer 106 may be silicon nitride, or vice versa. Alternatively, where hardmask layer 106 is made of a high-k dielectric material, the dielectric material of via guide sections 116A-116C may be a low-k dielectric material (a dielectric constant (k) less than a dielectric constant of $SiO_2$) such that the dielectric material of via guide sections 116A-116C can be etched at a different rate than or exclusive of a material for hardmask layer 106. It is further contemplated that in some embodiments, the dielectric material of via guide sections 116A-116C may be the same as spacers 110 such that via guide sections 116A-116C can be formed concurrently with formation of spacers 110 around backbone structures 108A-108D.

Figure 12:
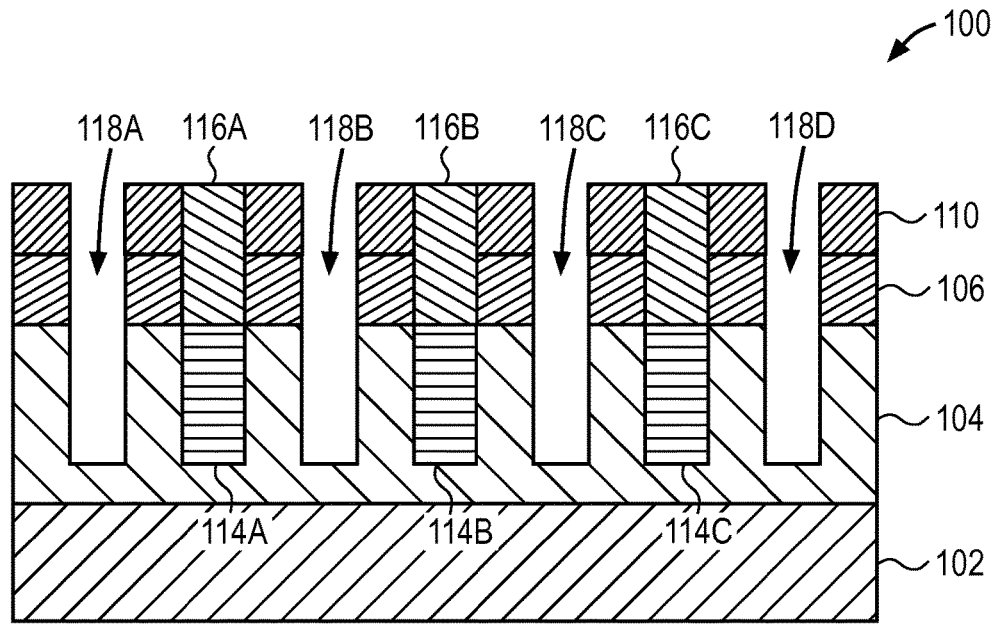
FIG. 12 shows the structure of FIG. 11 following removal of the backbone structure and etching of openings in the hardmask layer and underlying dielectric layer.

FIG. 12 shows the structure of FIG. 11 following removal of the backbone structure and etching of openings in the hardmask layer and underlying dielectric layer. Representatively, the remaining portions of backbone structures 108A-108D and sections of hardmask layer 106 and dielectric layer 104 underlying backbone structures 108A-108D are etched to form openings 118A, 118B, 118C and 118D. In some embodiments, backbone structures 108A-108D, sections of hardmask layer 106 and dielectric layer 104 are etched using a dry etch semiconductor processing technique. Representatively, structure 100 may be exposed to a plasma of reactive gases (e.g., fluorocarbons, oxygen, chlorine and/or boron trichloride) which are capable of etching backbone structures 108A-108D, hardmask layer 106 and dielectric layer 104 to a desired depth without etching spacers 110 and via guide sections 116A-116C.

Figure 13:
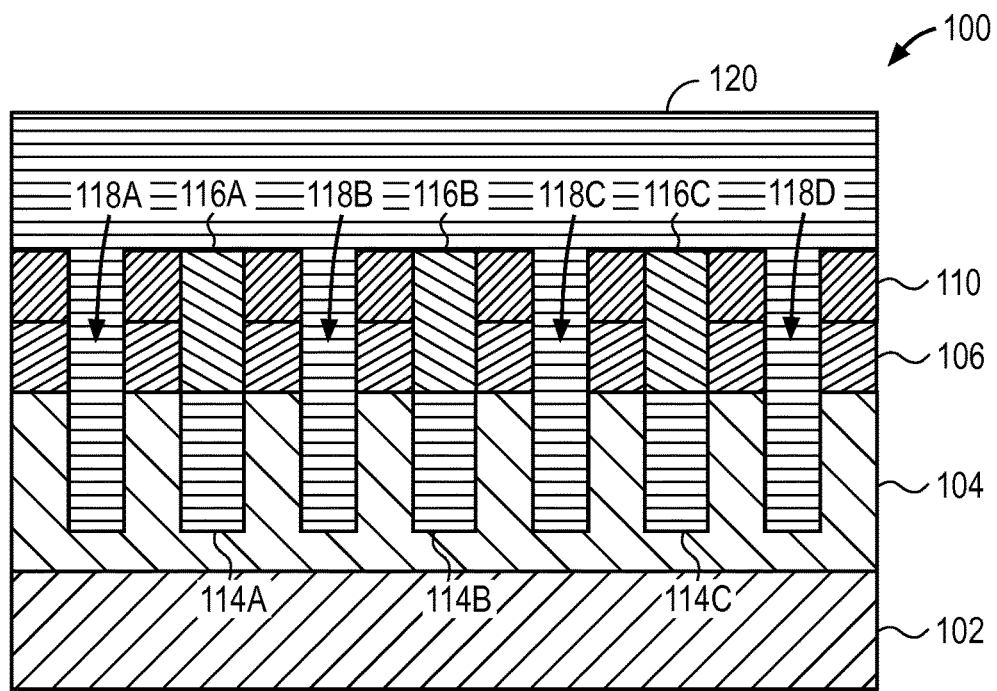
FIG. 13 shows the structure of FIG. 12 following filling of the openings with an interconnect material.

FIG. 13 shows the structure of FIG. 12 following filling of the openings with an interconnect material. Representatively, as illustrated in FIG. 13, openings 118A-118D are formed through dielectric layer 104 to a desired depth. Once formed, openings 118A-118D are filled with an interconnect material 120. Interconnect material 120 may be substantially the same as interconnect material 114 previously discussed in reference to FIG. 9, for example, copper, aluminum or tungsten.

Figure 14:
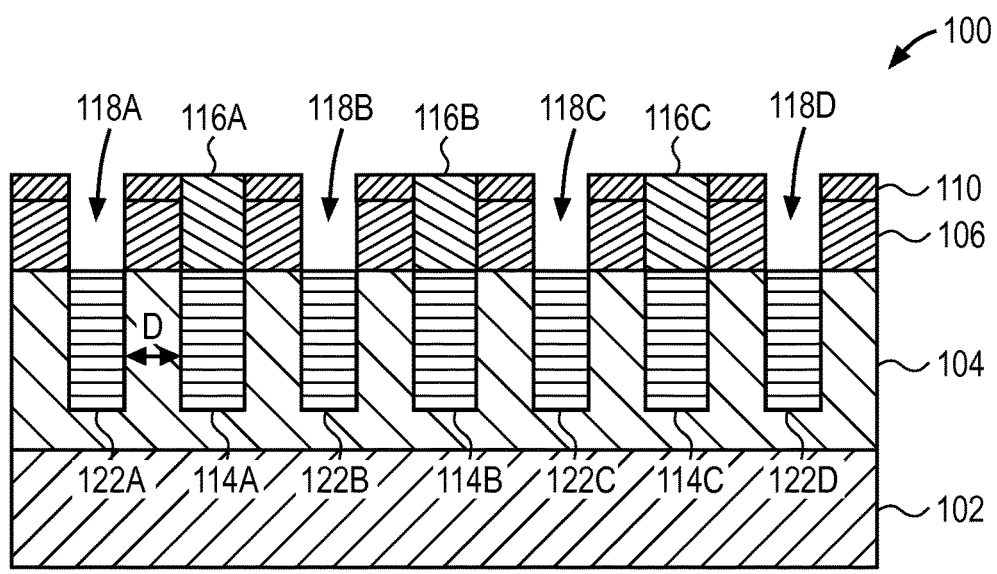
FIG. 14 shows the structure of FIG. 13 following polishing and recessing of the interconnect material to form interconnect lines within the dielectric layer.

FIG. 14 shows the structure of FIG. 13 following polishing and recessing of the interconnect material to form interconnect lines within the dielectric layer. Interconnect material 120 is polished using any standard polishing technique and the portions of interconnect material 120 remaining within openings 118A-118D are recessed below hardmask layer 106 to form a second set of interconnect lines 122A, 122B, 122C and 122D within dielectric layer 104. In one embodiment, interconnect material 120 may be recessed with a wet etch process designed to selectively etch interconnect material 120 without etching any other materials (e.g. spacers 110, via guide sections 116A-116C and hardmask layer 106). Interconnect lines 122A-122D may be, for example, wiring lines that are used to provide connections to and between devices connected to other interconnect layers or lines within other planes of structure 100. Interconnect lines 122A-122D may have a similar size and dimensions to interconnect lines 114A-114C, and may further be parallel to interconnect lines 114A-114C. In addition, a pitch of interconnect lines 122A-122D and interconnect lines 114A-114C may be relatively small such that they are considered to have a tight pitch. For example, interconnect lines 122A-122D and interconnect lines 114A-114C may be considered to have a tight pitch where a distance (D) between the lines is less than 80 nm.

Figure 15:
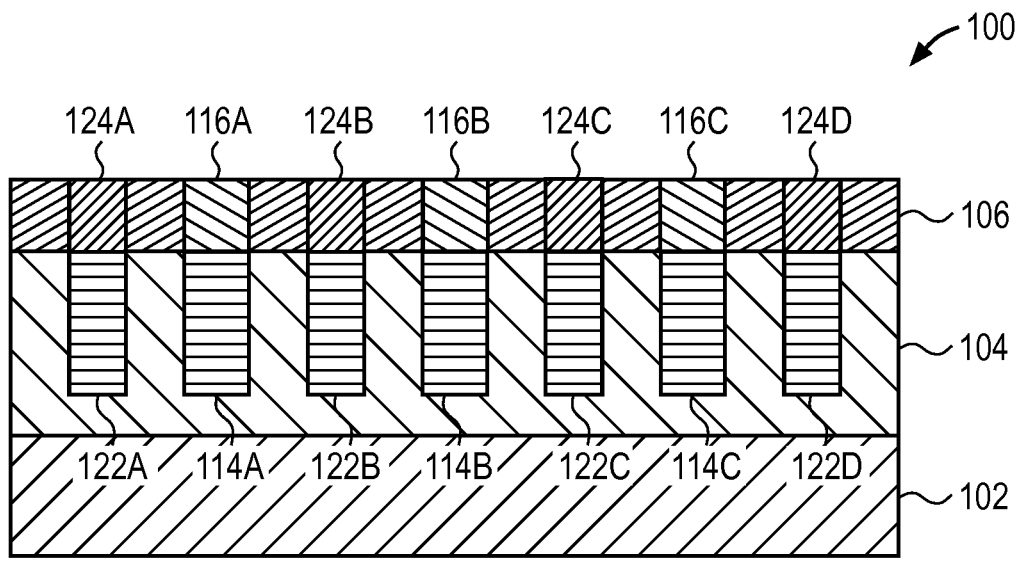
FIG. 15 shows the structure of FIG. 14 following filling of the openings within the hardmask layer with a hardmask material to form another set of via guide sections.

FIG. 15 shows the structure of FIG. 14 following filling of the openings within the hardmask layer with another hardmask material to form another set of via guide sections. In particular, the portions of openings 118A-118D remaining above interconnect lines 122A-122D are filled with a hardmask material. The hardmask material is subsequently polished along with spacers 110 to form a second set of via guide sections 124A, 124B, 124C and 124D within hardmask layer 106. The hardmask material of via guide sections 124A, 124B, 124C and 124D is a hardmask material different than the hardmask material of the first set of via guide sections 116A-116C and hardmask layer 106. Representatively, the hardmask material of the second set of via guide sections 124A-124D may include a dielectric material which is sufficiently different chemically than the material of via guide sections 116A-116C and hardmask layer 106 to allow for etching of the hardmask material of via guide sections 124A-124D selective to via guide sections 116A-116C and hardmask layer 106. Representative dielectric materials may include, but are not limited to, various oxides, nitrides and carbides, for example, silicon oxide, titanium oxide, hafnium oxide, aluminum oxide, oxynitride, zirconium oxide, hafnium silicate, lanthanum oxide, silicon nitride, boron nitride, amorphous carbon, silicon carbide and other similar dielectric materials. For example, where hardmask layer 106 is formed using silicon oxide and via guide sections 116A-116C include silicon nitride, via guide sections 124A-124D may include silicon carbide.

The resulting structure 100 of FIG. 15 therefore includes hardmask layer 106 having via guide sections 116A-116C of one hardmask material alternating with via guide sections 124A-124D of another, different, hardmask material. In addition, each of via guide sections 116A-116C and via guide sections 124A-124D are separated by a third hardmask material, namely that of hardmask layer 106, which is different from the hardmask materials of each of via guide sections 116A-116C and 124A-124D. In this aspect, a hardmask layer 106 having at least three different hardmask materials with different etch selectivities, all within a single hardmask layer, is formed. The at least three different hardmask materials alternate throughout the hardmask layer 106 such that no two of the same hardmask materials contact one another within hardmask layer 106.

Although three different materials are described as being used in hardmask layer 106, hardmask layer 106 may include more or less materials depending upon the pitch of interconnect lines 114A-114C and interconnect lines 122A-122D. In particular, each of the alternating via guide sections 116A-116C and via guide sections 124A-124D are aligned over interconnect lines 114A-114C and interconnect lines 122A-122D, respectively. Thus, via guide sections 116A-116C and via guide sections 124A-124D protect the underlying interconnect lines 114A-114C and interconnect lines 122A-122D, respectively, from connecting to another interconnect layer or line having an associated via which may overlap the protected interconnect lines (see, for example, FIG. 25). Thus, where a pitch between interconnect lines is tight, overlap is more likely to occur and therefore more via guide sections are necessary to protect each of the nearby interconnect lines. Where the pitch between interconnect lines is greater, however, fewer via guide sections may be sufficient since the overlying interconnect line and associated via is less likely to be wide enough to overlap the nearby interconnect lines.

Figure 16:
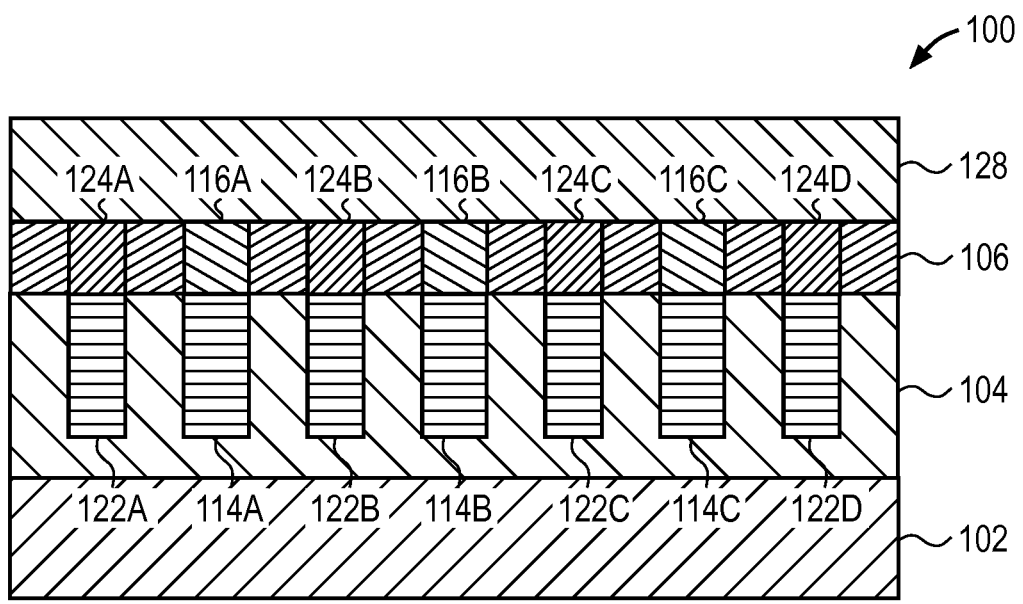
FIG. 16 shows the structure of FIG. 15 following formation of a dielectric layer over the hardmask layer.

FIG. 16 shows the structure of FIG. 15 following formation of a dielectric layer over the hardmask layer. Once hardmask layer 106 is completely formed, subsequent processing steps as described in reference to FIG. 16-FIG. 24 may be performed to form an open via guide within hardmask layer 106 for electrical connection of a further interconnect layer to one or more of interconnect lines 122A-122D and 114A-114C. Dielectric layer 128 may be made of any of the previously discussed dielectric materials, for example, a low k material containing silicon, carbon and oxygen which may be referred to as polymers and that are known in the art.

Figure 17:
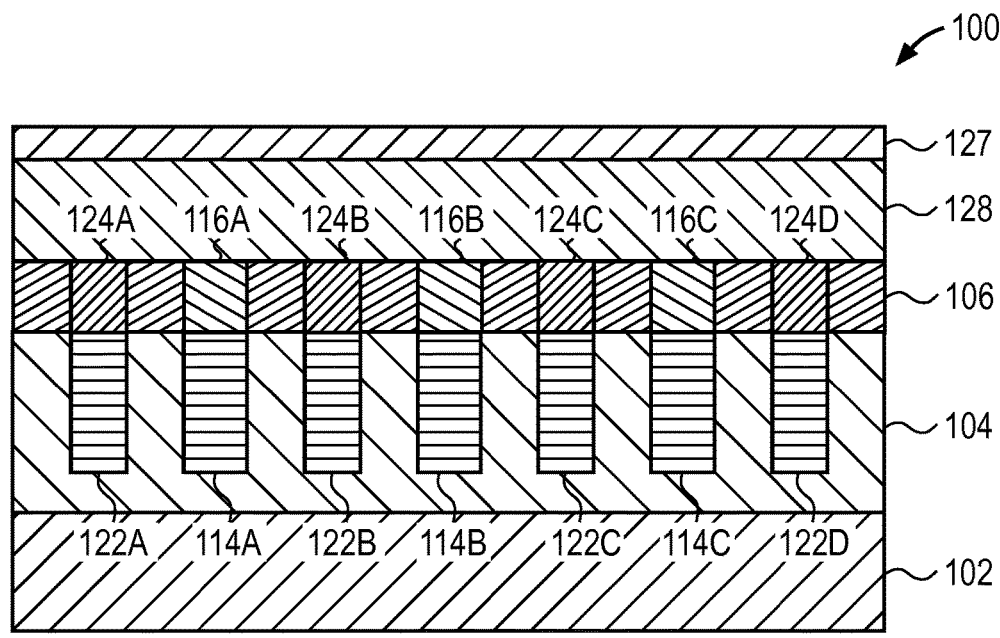
FIG. 17 shows the structure of FIG. 16 following formation of a hardmask layer over the dielectric layer.

FIG. 17 shows the structure of FIG. 16 following formation of a hardmask layer over the dielectric layer. Hardmask layer 127, which may be made of any of the previously discussed hardmask materials, may then be applied over the dielectric layer 128.

Figure 18:
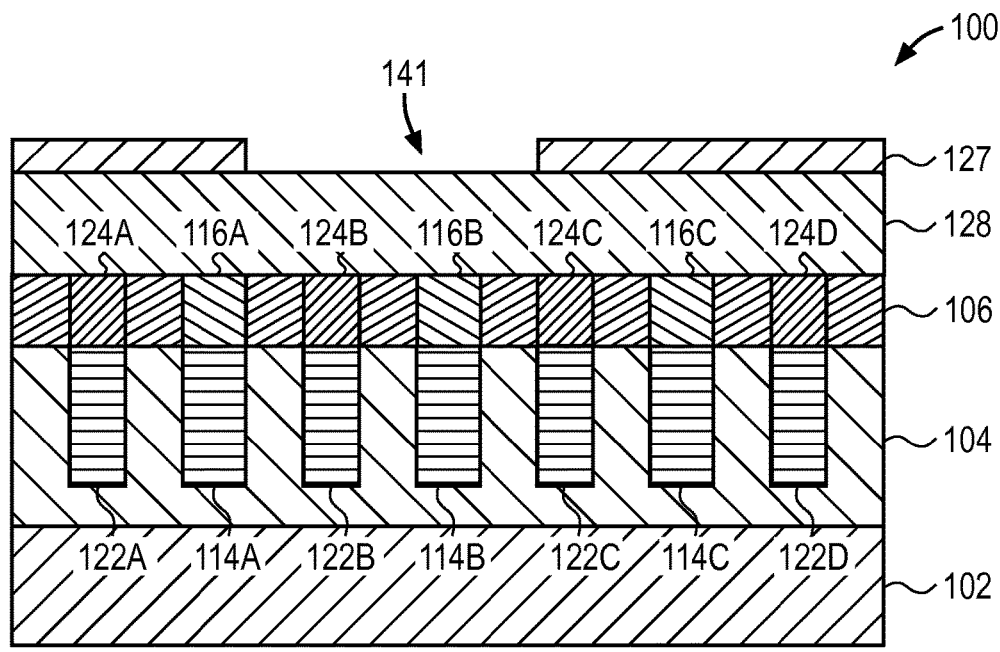
FIG. 18 shows the structure of FIG. 17 following patterning of the hardmask layer.

FIG. 18 shows the structure of FIG. 17 following patterning of the hardmask layer. Hardmask layer 127 may be patterned using any standard lithography and etch processing techniques to form an opening 141. Opening 141 will provide the pattern for subsequent formation of an interconnect opening for formation of another interconnect layer within dielectric layer 128 and therefore should be positioned over an interconnect line (e.g. interconnect line 122B) that the interconnect layer is to be connected to.

Figure 19:
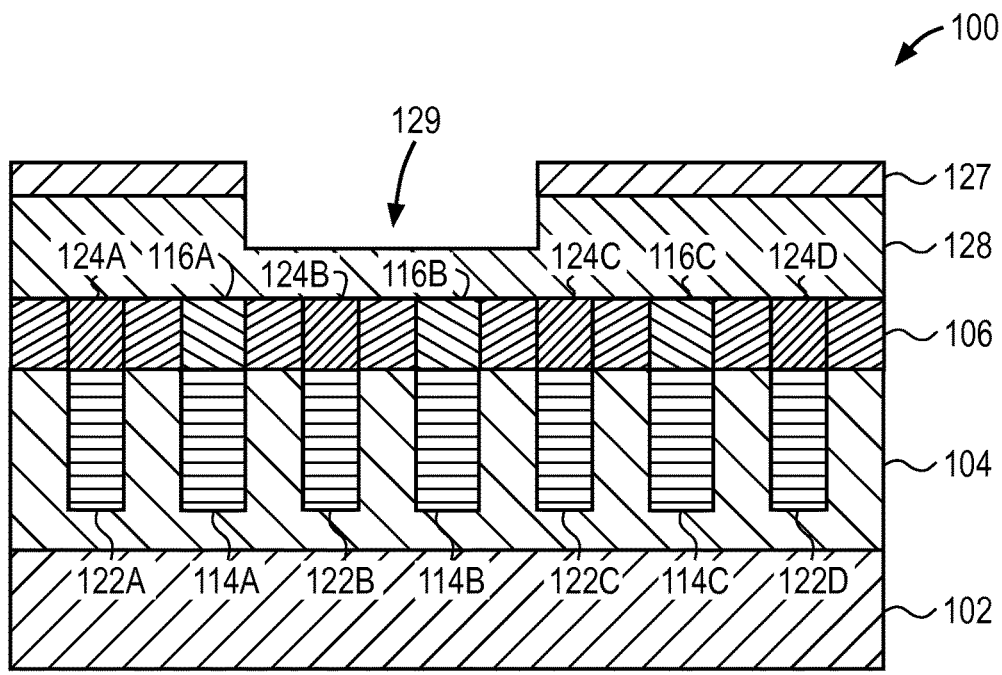
FIG. 19 shows the structure of FIG. 18 following etching of an interconnect opening within the dielectric layer.

FIG. 19 shows the structure of FIG. 18 following etching of an interconnect opening within the dielectric layer. The patterned hardmask layer 127 having opening 141 is used to etch interconnect opening 129 within dielectric layer 128. Interconnect opening 129 may be etched using any standard semiconductor processing technique, for example, a dry etch technique. Interconnect opening 129 may be used to form an overlying interconnect layer as will be described further in reference to FIG. 25.

Figure 20:
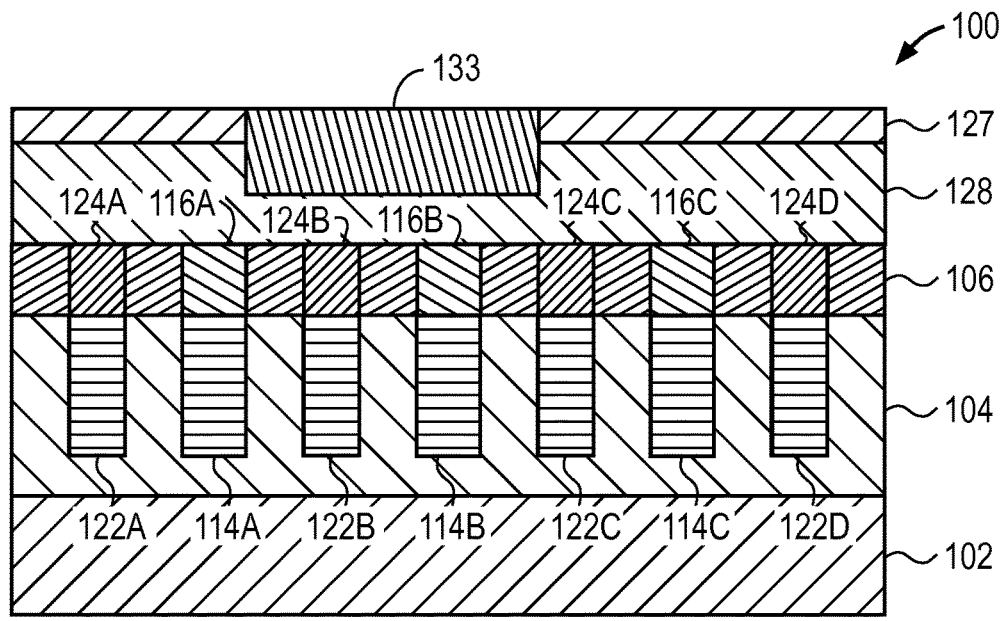
FIG. 20 shows the structure of FIG. 19 following formation of a hardmask layer within the interconnect opening.

FIG. 20 shows the structure of FIG. 19 following formation of a hardmask layer within the interconnect opening. Prior to forming the interconnect layer, a further hardmask layer 133 may be formed within interconnect opening 129 according to any standard processing technique. For example, hardmask layer 133 may be applied over hardmask layer 127 and interconnect opening 129 and then polished such that it remains only in interconnect opening 129.

Figure 21:
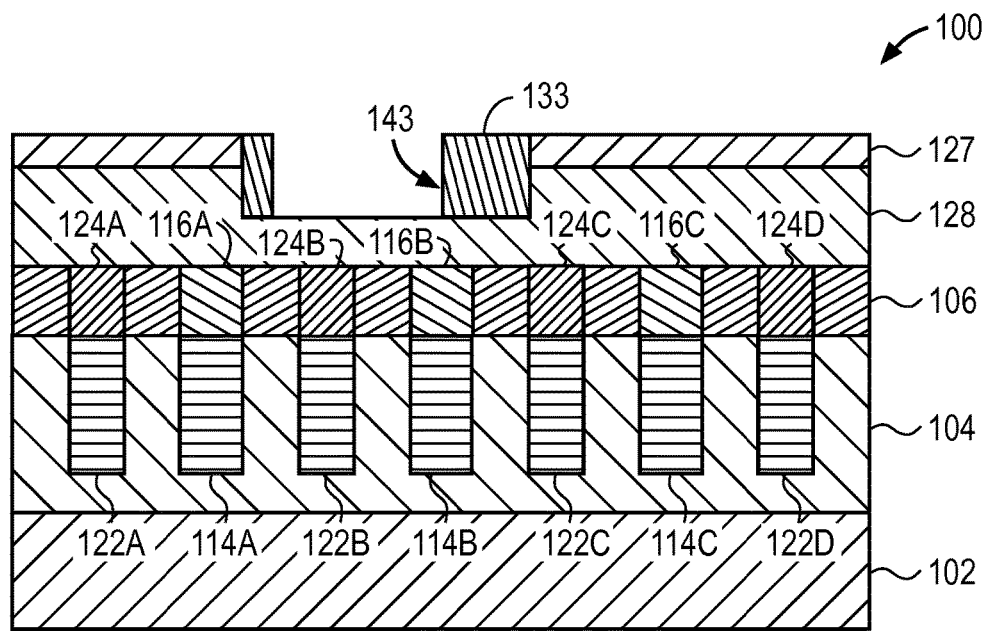
FIG. 21 shows the structure of FIG. 20 following patterning of the hardmask layer within the interconnect opening.

FIG. 21 shows the structure of FIG. 20 following patterning of the hardmask layer within the interconnect opening. Hardmask layer 133 may be patterned (e.g. using any standard lithography processing technique) such that it remains only along the sides of interconnect opening 129. In this aspect, hardmask layer 133 forms a narrower opening 143 within interconnect opening 129. This narrower opening 143 will subsequently be used to form a via opening within dielectric layer 128.

Figure 22:
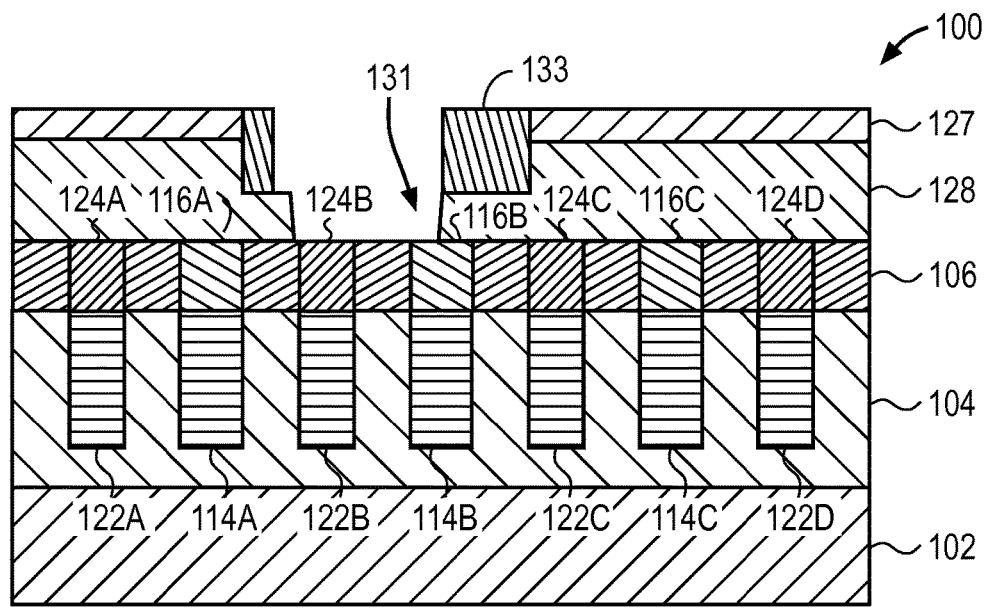
FIG. 22 shows the structure of FIG. 21 following etching of a via opening in the dielectric layer.

FIG. 22 shows the structure of FIG. 21 following etching of a via opening in the dielectric layer. Using the patterned hardmask layer 133, dielectric layer 128 is further etched (e.g. dry etch) to form a via opening 131 over hardmask layer 106. Via opening 131 is etched to a depth such that it extends to and exposes a portion of hardmask layer 106.

Figure 23:
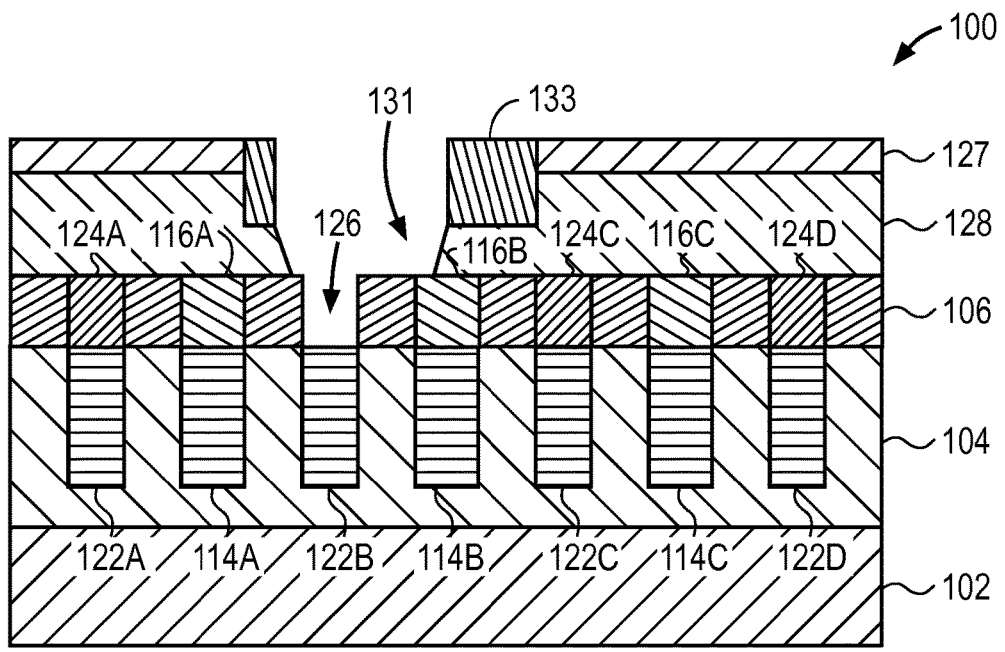
FIG. 23 shows the structure of FIG. 22 following etching of an open via guide in the hardmask layer.

FIG. 23 shows the structure of FIG. 22 following etching of an open via guide in the hardmask layer. Following formation of via opening 131, or concurrently with formation of via opening 131, the hardmask material within via guide section 124B is etched to form open via guide 126. In the illustrated example, the hardmask material within via guide section 124B is selectively etched, while the hardmask materials within the remaining via guide sections 116A-116C and 124A, 124C and 124D are not etched. In this aspect, a via guide 126, which is aligned with interconnect line 122B, is formed, while the other adjacent interconnect lines remain covered by the hardmask material within via guide sections 116A-116C and 124A, 124C and 124D. Since the adjacent interconnect lines, namely interconnect lines 114A and 114B, remain covered, any misalignment of an overlying via used to electrically connect another interconnect layer to interconnect lines 122B will not short circuit to the wrong interconnect line (e.g. interconnect lines 114A or 114B). It is to be understood, however, that although via guide 126 is formed in via guide section 124B, it could be formed in any of the other via guide sections if connection with a different interconnect line is desired. In addition, although a single via guide 126 is illustrated, it is to be understood that more than one via guide may be formed where connection between additional interconnect lines is desired.

Figure 24:
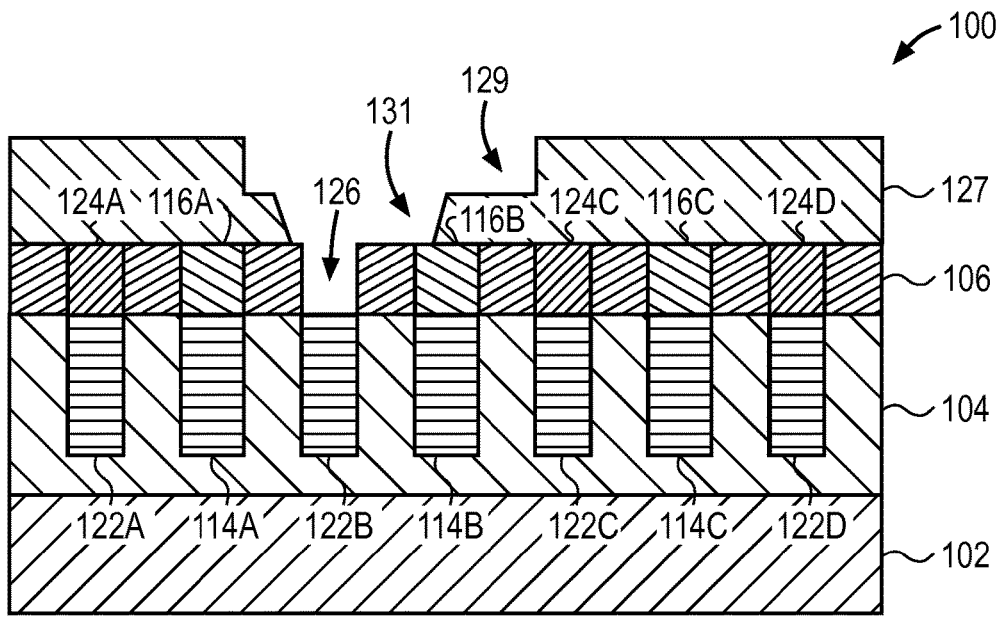
FIG. 24 shows the structure of FIG. 23 following removal of the hardmask layers.

FIG. 24 shows the structure of FIG. 23 following removal of the hardmask layers 127 and 133. Hardmask layers 127 and 133 may be removed through any standard processing technique, for example, stripping, in order to expose interconnect opening 129 for formation of the interconnect layer therein.

Figure 25:
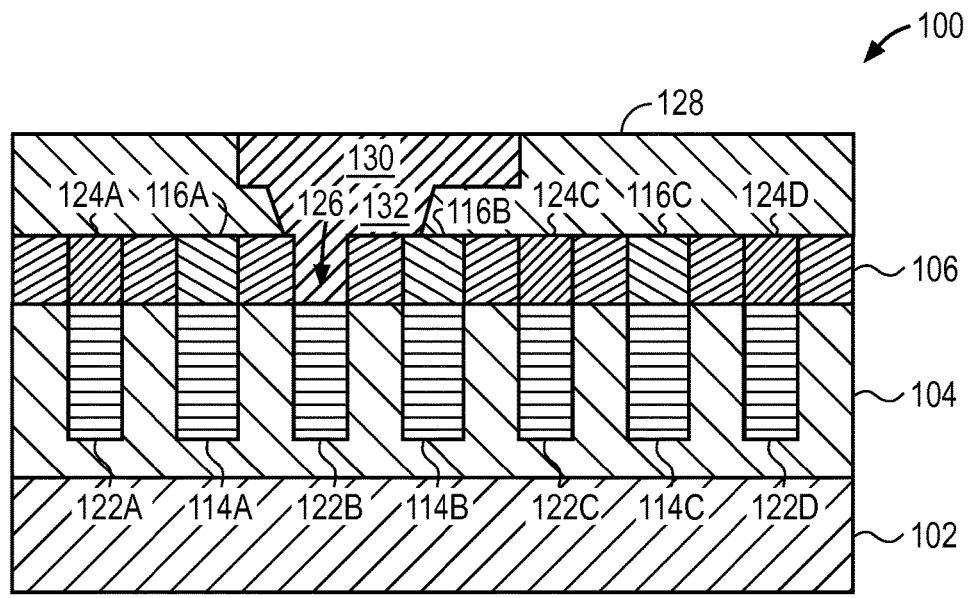
FIG. 25 shows the structure of FIG. 24 following formation of an interconnect layer within the interconnect opening and connecting the interconnect layer to one of the interconnect lines through the via and the open via guide.

FIG. 25 shows the structure of FIG. 24 following formation of an interconnect layer and connecting the interconnect layer to one of the interconnect lines. Interconnect layer 130 is formed within interconnect opening 129. In this aspect, interconnect layer 130 is within a different plane of structure 100 than the previously discussed interconnect lines 114A-114C and 122A-122D (e.g. a plane above hardmask layer 106 while interconnect lines 114A-114C and 122A-122D are in a plane below hardmask layer 106). A via 132 is formed within via opening 131 overlying open via guide 126. In this aspect, an interconnect material (e.g. a metal) can electrically interconnect layer 130 to interconnect line 122B through via 132 and open via guide 126. It is noted that even though via 132 is slightly misaligned with respect to open via guide 126, it does not short circuit to any nearby interconnect lines (e.g. interconnect line 114B) because they remain covered by hardmask layer 106.

To form interconnect layer 130 and via 132 within openings 129 and 131 respectively, and fill via guide 126, a coating of metal (e.g. copper) that fills via guide 126 and openings 129 and 131 may be deposited on dielectric layer 128, and chemical-mechanical planarization (CMP) may be used to remove any of the metal that extends above the top of dielectric layer 128. The metal sunken within via guide 126 and openings 129 and 131 of dielectric layer 128 is not removed and becomes the interconnect layer 130 and metal fill for via 132. The metal further fills via guide 126 thereby electrically connecting interconnect layer 130 to interconnect line 122B.

It is noted that although via 132 is wider than interconnect line 122B and overlaps hardmask layer 106 and interconnect line 114B, regardless of the placement and size of via 132, interconnect layer 130 can only connect to interconnect line 122B because the adjacent interconnect lines, for example interconnect line 114B, is covered by hardmask layer 106.

It is to be understood that although FIG. 16 to FIG. 25 illustrate one exemplary process for forming a via guide and interconnect layer with associated via, other processes may further be used to form the via guide and interconnect layer. Representatively, masking and etching steps for selectively forming a via guide in one of the via guide sections may be performed prior to formation of the overlying interconnect layer and via.

Figure 26:
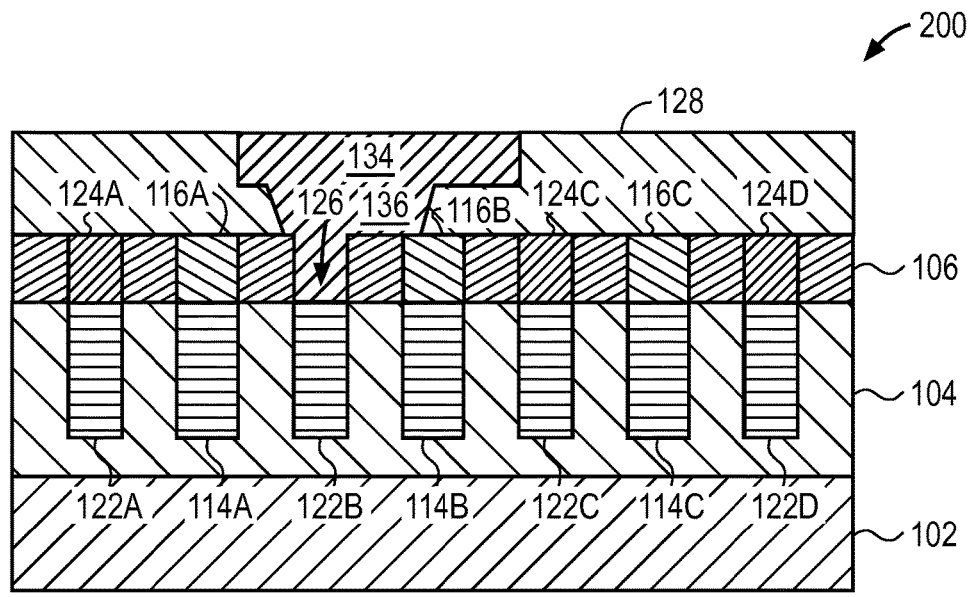
FIG. 26 shows an alternative interconnect layer connected to one of the interconnect lines through a via and open via guide similar to that of FIG. 24.

FIG. 26 shows an alternative interconnect layer connected to one of the interconnect lines through a via opening and via guide similar to that of FIG. 25. Similar to structure 100 of FIG. 25, structure 200 includes interconnect layer 134 and via 136 formed within a portion of dielectric layer 128 overlying interconnect line 122B. In this embodiment, however, via 136 is aligned with open via guide 126. Interconnect layer 134, via 136 and open via guide 126 may be formed as discussed in reference to FIG. 16 to FIG. 25.

As can be seen from FIG. 25 and FIG. 26, the via guide sections 116A-116C and 124A-124D enable connections between interconnect layers within different planes of an integrated circuit structure with less occurrences of short circuiting due to variations in via placement and size. Thus, the via size (e.g. size of via 136) can be much larger than standard sizes without shorting to the "wrong" interconnect layer or line. Larger via sizes, in turn, simplify any associated lithography process such that it may be less expensive and/or operate at a higher yield. In addition, the via overlap area to the under-lying interconnect layer or line can be manufacture much more consistently. Representatively, the via overlap area to underlying interconnect layer or line typically changes as a function of the via to underlying interconnect layer overlay as well as with via size variation. Both of these are known to have large variation compared to that of controlling the size of a simple one-dimensional structure. In contrast, via overlap to underlying interconnect layer using a guided via structure (e.g. open via guide 126) as disclosed herein will only depend on the upper interconnect layer to underlying interconnect layer width, which can be well controlled in typical manufacturing processes. More consistent via overlap, in turn, gives a more consistent via resistance that enables better chip electrical performance. Finally, the guided via structures disclosed herein can allow for access to very small underlying interconnect line pitches (e.g. the distance between lines) without risk of via shorting to the wrong interconnect line. By enabling connection to tighter pitches, overall chip size can be reduced for a given yield. Smaller chip sizes, in turn, reduce manufacturing costs and improve electrical performance. It should further be understood that in each of the embodiments discussed herein the margin for error/misalignment is much larger than in conventional devices and the resulting via is aligned with the desired interconnect through the via guide.

Figure 27:
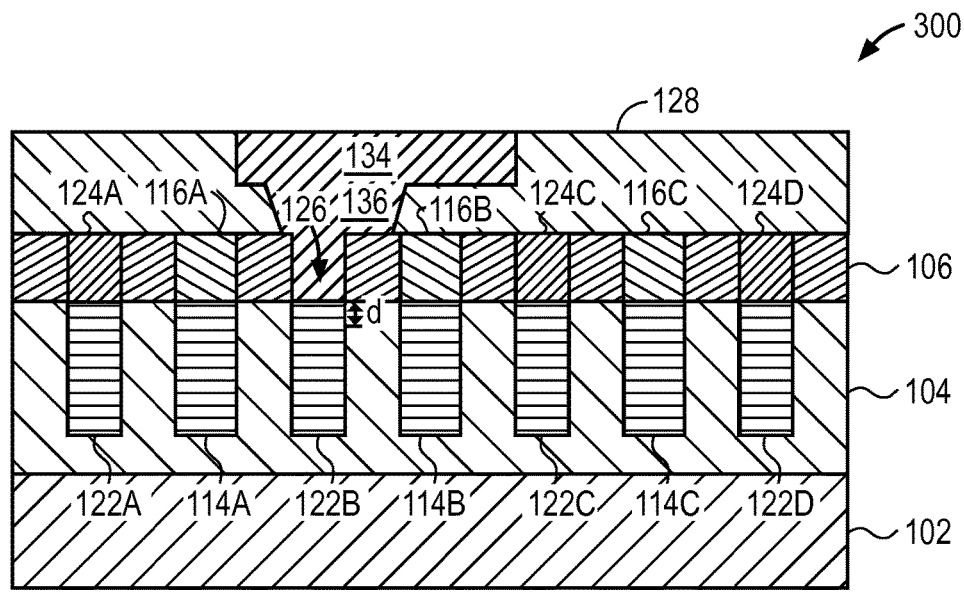
FIG. 27 shows a schematic cross-sectional side view of another embodiment of an interconnect layer connecting to an interconnect line through an open via guide.

FIG. 27 shows a schematic cross-sectional side view of an alternative circuit structure. Structure 300 is substantially similar, and formed in a similar manner, to structure 200 illustrated in FIG. 26 except that in this embodiment, interconnect lines 114A-114C and 122A-122D are recessed a distance (d) below hardmask layer 106. Representatively, returning to the processing steps described in reference to FIG. 10 and FIG. 14, in which recessing of the interconnect materials to form interconnect lines 114A-114C and 122A-122D are described, instead of etching (e.g. using a wet etch process) the interconnect material to the bottom of hardmask layer 106, the interconnect material is etched a distance (d) below hardmask layer 106. In this aspect, interconnect lines 114A-114C and 122A-122D are recessed a distance (d) below hardmask layer 106. The remaining processing steps described in reference to FIG. 16-FIG. 25 are then followed to form structure 300. By separating or recessing interconnect lines 122B, 114B and 122C a distance (d) from hardmask layer 106, a metal to metal capacitance of structure 300 can be improved, which in turn results in improved electrical performance.

Figure 28:
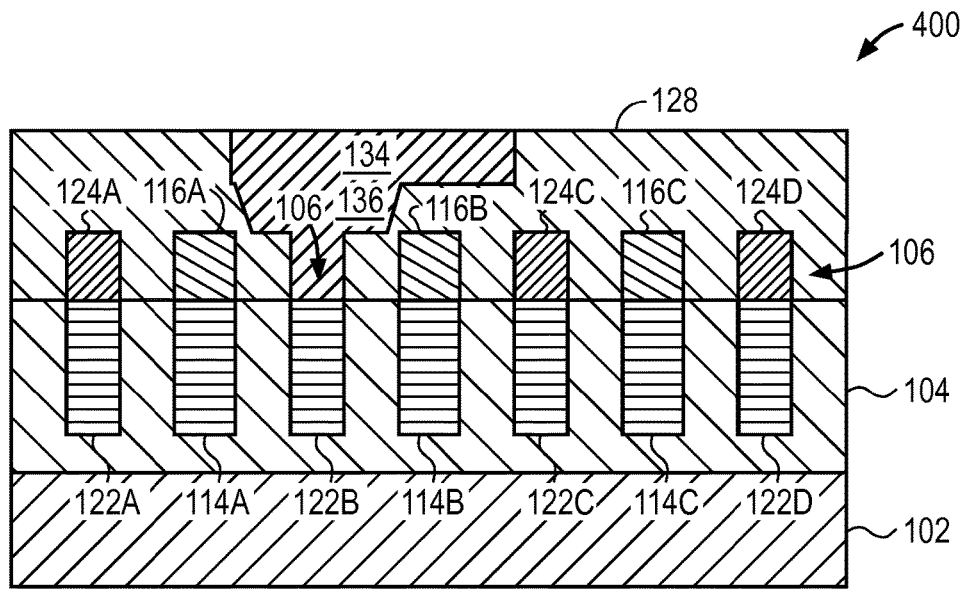
FIG. 28 shows a schematic cross-sectional side view of another embodiment of an interconnect layer connecting to an interconnect line through an open via guide.

FIG. 28 shows a schematic cross-sectional side view of an alternative circuit structure. Structure 400 is substantially similar, and formed in a similar manner, to structure 200 illustrated in FIG. 26 except that in this embodiment, the hardmask material of hardmask layer 106, which is between the alternating via guide sections 116A-116C and 124A-124D, is removed. Representatively, an additional polishing or etching step can be introduced after formation of via guide sections 124A-124D as described in reference to FIG. 15 to remove portions of hardmask layer 106 between via guide sections 116A-116C and 124A-124B.

Figure 29:
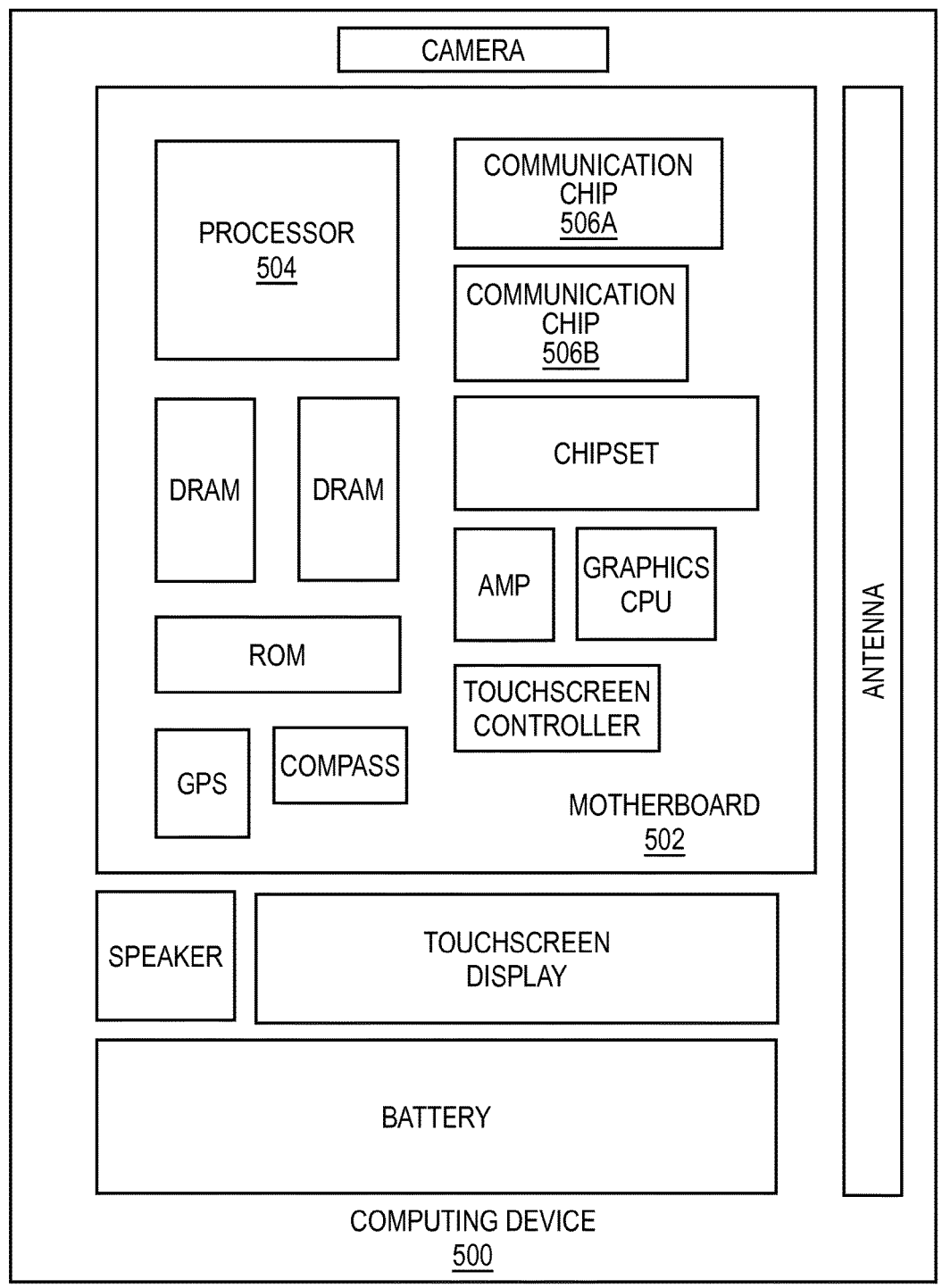
FIG. 29 shows a schematic illustration of a computing device.

FIG. 29 shows a schematic illustration of a computing device in accordance with one implementation. Computing device 500 houses board 502. Board 502 may include a number of components, including but not limited to a processor 504 and at least one communication chip 506A, 506B. Processor 504 is physically and electrically connected to board 502. In some implementations the at least one communication chip 506A, 506B is also physically and electrically connected to board 502. In further implementations, the communication chip 506A, 506B is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506A, 506B enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506A, 506B may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506A, 506B. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the integrated circuit die of the processor includes one or more devices, such as transistors or interconnectors, that are formed in accordance with implementations described above where one or more dielectric layers (ILD) are covered with a dielectric hard mask that may be retained in the final circuit die structure. The term "processor" may refer to any device or portion of a device that processes electronic data from registers and/or memory to transform that electronic data into other electronic data that may be stored in registers and/or memory.

The communication chip 506A, 506B also includes an integrated circuit die packaged within the communication chip 506A, 506B. In accordance with another implementation of the invention, the integrated circuit die of the communication chip includes one or more devices, such as transistors or interconnectors, that are formed in accordance with implementations described above incorporating a dielectric hard mask on one or more dielectric layers.

In further implementations, another component housed within the computing device 500 may contain an integrated circuit die that includes one or more devices, such as transistors or interconnectors, that are formed in accordance with implementations described above incorporating a dielectric hard mask on one or more dielectric layers.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The following examples pertain to further embodiments. Specifics in the examples may be used anywhere in one or more embodiments. All optional features of the apparatus described herein may also be implemented with respect to a method or process.

For example, an apparatus comprises: a circuit substrate; a first interconnect layer in a first plane on the substrate and a second interconnect layer in a different second plane on the substrate; and a hardmask layer separating the first interconnect layer and the second interconnect layer, wherein the hardmask layer comprises alternating guide sections, each of the alternating guide sections comprising different hard mask materials, and a via guide formed in at least one of the alternating guide sections for electrical connection of the first interconnect layer to the second interconnect layer.

In one embodiment, the first interconnect layer comprises a plurality of interconnect lines and each of the plurality of interconnect lines are aligned with one of the alternating guide sections. In one embodiment, the different hardmask materials comprise at least two different hardmask materials which allow for etching of one of the hardmask materials selective to the other of the hardmask materials. In one embodiment, the different hardmask materials comprise a first hardmask material and a second hardmask material and each of the alternating guide sections are separated by a third hardmask material. In one embodiment, the different hardmask materials comprise at least two dielectric materials selected from the group consisting of silicon oxide, silicon nitride, silicon carbide, titanium oxide, hafnium oxide, aluminum nitride, boron nitride and amorphous carbon. In one embodiment, the via guide is a first via guide and a second via guide is formed in another of the alternating guide sections.

In another example, a method comprises: forming a dielectric layer on an integrated circuit structure; forming a first interconnect layer having interconnect lines in the dielectric layer; forming a hardmask layer on a surface of the dielectric layer, the hardmask layer comprising alternating hardmask materials which form via guide sections over the interconnect lines; forming an open via guide in one of the via guide sections; and forming a second interconnect layer over the hardmask guide layer, wherein the second interconnect layer is electrically connected to one of the interconnect lines through the open via guide.

In one embodiment, forming the hardmask layer comprises: depositing a first hardmask material on the dielectric layer; etching the first hardmask material to form a first set of openings; filling the first set of openings with a second hardmask material; etching the first hardmask material to form a second set of openings; and filling the second set of openings with a third hardmask material. In one embodiment, the first hardmask material remains between the first set of openings and the second set of openings. In one embodiment, the alternating hardmask materials comprise at least two different hardmask materials which allow for etching of one of the at least two different hardmask materials selective to the other of the at least two different hardmask materials. In one embodiment, the via guide sections comprise a first set of via guide sections aligned with a first set of the interconnect lines and a second set of via guide sections aligned with a second set of the interconnect lines. In one embodiment, the first group of via guide sections are formed by a first hardmask material and the second group of via guide sections are formed by a second hardmask material different than the first hardmask material. In one embodiment, the hardmask materials comprise at least two dielectric materials selected from the group consisting of silicon oxide, silicon nitride, silicon carbide, titanium oxide, hafnium oxide, aluminum nitride, boron nitride and amorphous carbon.

In another example, a method comprises: depositing a dielectric layer on an integrated circuit structure; forming a plurality of first interconnect lines in the dielectric layer; forming a hardmask layer on a surface of the dielectric layer, the hardmask layer comprising different hardmask materials aligned with the plurality of first interconnect lines; selectively etching the hardmask layer to form an open via guide through one of the different hardmask materials; forming a second interconnect line on the hardmask layer; and electrically connecting one of the plurality of first interconnect lines to the second interconnect line through the open via guide.

In one embodiment, the different hardmask materials comprise a first hardmask material aligned with a first set of the first interconnect lines and a second hardmask material aligned with a second set of the first interconnect lines. In one embodiment, the hardmask layer comprises a third hardmask material between the first hardmask material and the second hardmask material. In one embodiment, forming the hardmask layer comprises: depositing a first hardmask material on the dielectric layer; etching the first hardmask material to form a first set of openings aligned with a first set of the first interconnect lines; filling the first set of openings with a second hardmask material different than the first hardmask material; etching the first hardmask material to form a second set of openings aligned with a second set of the first interconnect lines; and filling the second set of openings with a third hardmask material different than the first hardmask material and the second hardmask material. In one embodiment, selectively etching the hardmask layer to form an open via guide comprises removing one of the hardmask materials to expose the aligned interconnect line without removing another different hardmask material aligned with an adjacent interconnet line. In one embodiment, the hardmask layer comprise at least three hardmask materials selected from the group consisting of silicon oxide, silicon nitride, silicon carbide, titanium oxide, hafnium oxide, aluminum nitride, boron nitride and amorphous carbon. In embodiment, the plurality of first interconnect lines are recessed a distance below the hardmask layer. In another embodiment, the different hardmask materials alternate with one another within the hardmask layer such that any adjacent first interconnect lines are aligned with a different one of the hardmask materials.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a circuit substrate;
   a first interconnect layer in a first plane on the substrate and a second interconnect layer in a different second plane on the substrate; and
   a hardmask layer separating the first interconnect layer and the second interconnect layer,
   wherein the hardmask layer comprises alternating guide sections, each of the alternating guide sections comprising different hard mask materials, and a via guide formed in at least one of the alternating guide sections for electrical connection of the first interconnect layer to the second interconnect layer.

2. The apparatus of claim 1 wherein the first interconnect layer comprises a plurality of interconnect lines and each of the plurality of interconnect lines are aligned with one of the alternating guide sections.

3. The apparatus of claim 1 wherein the different hardmask materials comprise at least two different hardmask materials which allow for etching of one of the hardmask materials selective to the other of the hardmask materials.

4. The apparatus of claim 1 wherein the different hardmask materials comprise a first hardmask material and a second hardmask material and each of the alternating guide sections are separated by a third hardmask material.

5. The apparatus of claim 1 wherein the different hardmask materials comprise at least two dielectric materials selected from the group consisting of silicon oxide, silicon nitride, silicon carbide, titanium oxide, hafnium oxide, aluminum nitride, boron nitride and amorphous carbon.

6. The apparatus of claim 1 wherein the via guide is a first via guide and a second via guide is formed in another of the alternating guide sections.

7. A method comprising:
   forming a dielectric layer on an integrated circuit structure;
   forming a first interconnect layer having interconnect lines in the dielectric layer;
   forming a hardmask layer on a surface of the dielectric layer, the hardmask layer comprising alternating hardmask materials which form guide sections over the interconnect lines;
   forming a via guide in one of the guide sections; and
   forming a second interconnect layer over the hardmask guide layer, wherein the second interconnect layer is electrically connected to one of the interconnect lines through the via guide.

8. The method of claim 7 wherein forming the hardmask layer comprises:
   depositing a first hardmask material on the dielectric layer;
   etching the first hardmask material to form a first set of openings;
   filling the first set of openings with a second hardmask material;
   etching the first hardmask material to form a second set of openings; and
   filling the second set of openings with a third hardmask material.

9. The method of claim 8 wherein the first hardmask material remains between the first set of openings and the second set of openings.

10. The method of claim 7 wherein the alternating hardmask materials comprise at least two different hardmask materials which allow for etching of one of the at least two different hardmask materials selective to the other of the at least two different hardmask materials.

11. The method of claim 7 wherein the guide sections comprise a first set of guide sections aligned with a first set of the interconnect lines and a second set of guide sections aligned with a second set of the interconnect lines.

12. The method of claim 11 wherein the first set of guide sections are formed by a first hardmask material and the second set of guide sections are formed by a second hardmask material different than the first hardmask material.

13. The method of claim 7 wherein the hardmask materials comprise at least two dielectric materials selected from the group consisting of silicon oxide, silicon nitride, silicon carbide, titanium oxide, hafnium oxide, aluminum nitride, boron nitride and amorphous carbon.

14. A method comprising:
depositing a dielectric layer on an integrated circuit structure;
forming a plurality of first interconnect lines having a tight pitch in the dielectric layer;
forming a hardmask layer on a surface of the dielectric layer, the hardmask layer comprising different hardmask materials aligned with the plurality of first interconnect lines;
selectively etching the hardmask layer to form an open via guide through one of the different hardmask materials;
forming a second interconnect line on the hardmask layer; and
electrically connecting one of the plurality of first interconnect lines to the second interconnect line through the open via guide.

15. The method of claim 14 wherein the different hardmask materials comprise a first hardmask material aligned with a first set of the first interconnect lines and a second hardmask material aligned with a second set of the first interconnect lines.

16. The method of claim 15 wherein the hardmask layer comprises a third hardmask material between the first hardmask material and the second hardmask material.

17. The method of claim 14 wherein forming the hardmask layer comprises:

depositing a first hardmask material on the dielectric layer;
etching the first hardmask material to form a first set of openings aligned with a first set of the first interconnect lines;
filling the first set of openings with a second hardmask material different than the first hardmask material;
etching the first hardmask material to form a second set of openings aligned with a second set of the first interconnect lines; and
filling the second set of openings with a third hardmask material different than the first hardmask material and the second hardmask material.

18. The method of claim 14 wherein selectively etching the hardmask layer to form an open via guide comprises removing one of the hardmask materials to expose the aligned interconnect line without removing another different hardmask material aligned with an adjacent interconnet line.

19. The method of claim 14 wherein the plurality of first interconnect lines are recessed a distance below the hardmask layer.

20. The method of claim 14 wherein the different hardmask materials alternate with one another within the hardmask layer such that any adjacent first interconnect lines are aligned with a different one of the hardmask materials.

* * * * *